(12) United States Patent
Jeter et al.

(10) Patent No.: US 9,928,890 B2
(45) Date of Patent: Mar. 27, 2018

(54) SYSTEM AND METHOD FOR CALIBRATING MEMORY USING CREDIT-BASED SEGMENTATION CONTROL

(71) Applicant: Apple Inc., Cupertino, CA (US)

(72) Inventors: Robert E. Jeter, Santa Clara, CA (US); Rakesh L. Notani, Sunnyvale, CA (US); Kai Lun Hsiung, Fremont, CA (US); Alma L. Juarez Dominguez, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/249,962

(22) Filed: Aug. 29, 2016

(65) Prior Publication Data

US 2018/0061465 A1 Mar. 1, 2018

(51) Int. Cl.
*G11C 7/22* (2006.01)
*G11C 7/10* (2006.01)

(52) U.S. Cl.
CPC . *G11C 7/22* (2013.01); *G11C 7/10* (2013.01)

(58) Field of Classification Search
CPC .............................................. G11C 2207/2254
USPC ....................................................... 365/194
See application file for complete search history.

(56) References Cited

U.S. PATENT DOCUMENTS

| 6,889,334 | B1 | 5/2005 | Magro | |
|---|---|---|---|---|
| 8,930,710 | B2 | 1/2015 | Baltes | |
| 8,947,140 | B2 | 2/2015 | Iyer | |
| 8,949,520 | B2 | 2/2015 | Ware | |
| 2006/0103439 | A1* | 5/2006 | Roth | G06F 5/08 327/156 |
| 2007/0226397 | A1* | 9/2007 | Gouder De Beauregard | G06F 3/0613 711/100 |
| 2008/0059718 | A1* | 3/2008 | Tajima | G06F 3/061 711/148 |
| 2010/0264903 | A1* | 10/2010 | Canac | H03L 7/07 324/76.77 |
| 2011/0283060 | A1* | 11/2011 | Ware | G06F 13/1636 711/106 |
| 2013/0063193 | A1* | 3/2013 | Zhang | H04L 7/0337 327/157 |
| 2014/0019792 | A1* | 1/2014 | Oh | G06F 13/1689 713/501 |
| 2014/0022102 | A1* | 1/2014 | Cho | H03M 3/38 341/120 |

(Continued)

*Primary Examiner* — Min Huang
(74) *Attorney, Agent, or Firm* — Meyertons, Hood, Kivlin, Kowert & Goetzel, P.C.; Eric A. Heter

(57) ABSTRACT

A system and method for calibrating memory using credit-based segmentation control is disclosed. A memory and a memory controller coupled thereto. The memory controller includes a calibration circuit configured to calibrate a data strobe signal conveyed to/from the memory. The calibration may be subdivided, in time, into a number of segments. The memory controller also includes a credit circuit configured to provide a condition code to the calibration circuit. The condition code may be indicative of an amount of time a request has been pending, or how many request are pending. If the condition code indicates that a request has been pending for more than a certain amount of time, the calibration may be terminated.

19 Claims, 7 Drawing Sheets

(56) References Cited

U.S. PATENT DOCUMENTS

2016/0071566 A1\* 3/2016 Noro .................... H03K 19/003
                                                     365/51
2016/0173108 A1\* 6/2016 Oshita ................. G11C 11/4076
                                                     365/189.05

\* cited by examiner

SYSTEM AND METHOD FOR CALIBRATING MEMORY USING CREDIT-BASED SEGMENTATION CONTROL

BACKGROUND

Technical Field

This disclosure is directed to memory subsystems, and more particularly, calibration of signals conveyed in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern as well as to determine the threshold voltage for distinguishing between logic 0's and logic 1's. Performing these calibrations typically includes adjusting a number of different parameters that govern transmission of data between a memory controller and a memory. Such calibrations may be performed on a periodic basis. Additionally, since some systems have multiple operating points (e.g., combinations of clock frequency and supply voltage), calibrations may also be performed upon a switch from one operating point to another.

SUMMARY

A system and method for calibrating memory using credit-based segmentation control is disclosed. In one embodiment, a memory and a memory controller coupled thereto. The memory controller includes a calibration circuit configured to calibrate a data strobe signal conveyed to/from the memory. The calibration may be subdivided, in time, into a number of segments. The memory controller also includes a credit circuit configured to provide a condition code to the calibration circuit. The condition code may be indicative of an amount of time a request has been pending, or how many request are pending. If the condition code indicates that a request has been pending for more than a certain amount of time, the calibration may be terminated.

In one embodiment, the credit circuit may provide one of a red condition code, a yellow condition code, or a green condition code. If the red condition code is provided, the calibration is inhibited from being performed (or terminated immediately if in progress). If the condition code is yellow, the calibration circuit will perform points or portions of calibration segments, based on the number of credits provided. After each point of calibration, the number of credits may be decremented. When the number of credits reaches zero while the condition code is yellow, the calibration is terminated. If the condition code is green the calibration may continue even after all credits have been used. When the green condition code is active, the calibration may continue until either the calibration is complete, or until the condition code changes to either yellow or red, after which the calibration is performed or terminated in accordance with those condition codes.

BRIEF DESCRIPTION OF THE DRAWINGS

The following detailed description makes reference to the accompanying drawings, which are now briefly described.

Figure 1:
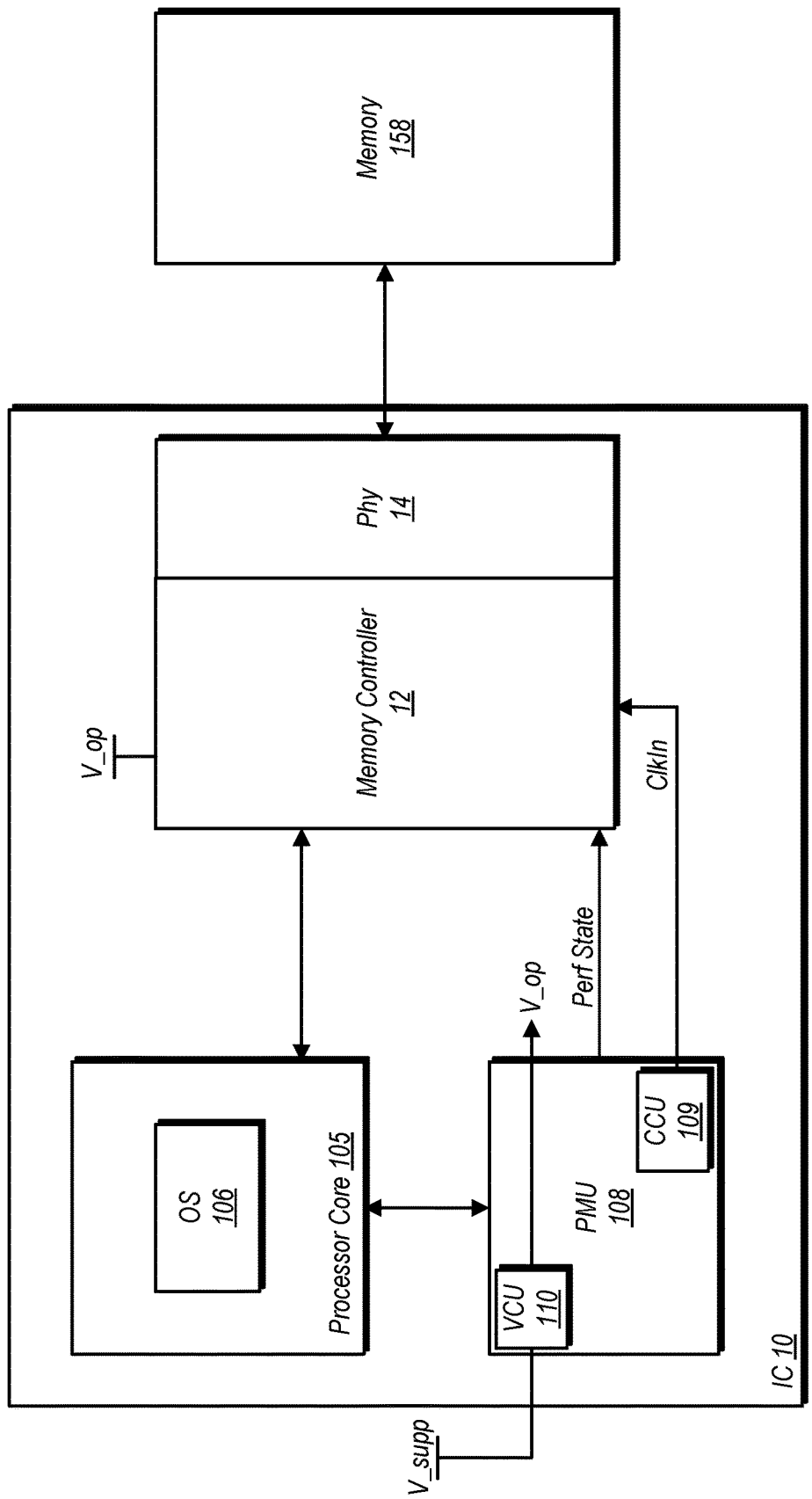
FIG. 1 is a block diagram of one embodiment of a system including a memory controller and a memory.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 106. The instructions of OS 106 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 106 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and/or operating voltage during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both. In addition to performance state changes, PMU 108 may also put into effect clock gating and/or power gating when various functional units and/or subsystems are idle. For example, if memory controller 12 is idle for a significant amount of time, PMU 108 may place it into a power gated state (i.e. power is removed therefrom), or alternatively, a clock gated state (i.e. a clock signal is inhibited from being provided thereto).

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending clock frequency change to perform certain actions. Among these action, as is discussed below, is to set certain parameters to pre-calibrated values upon entry into the new state.

Figure 2:
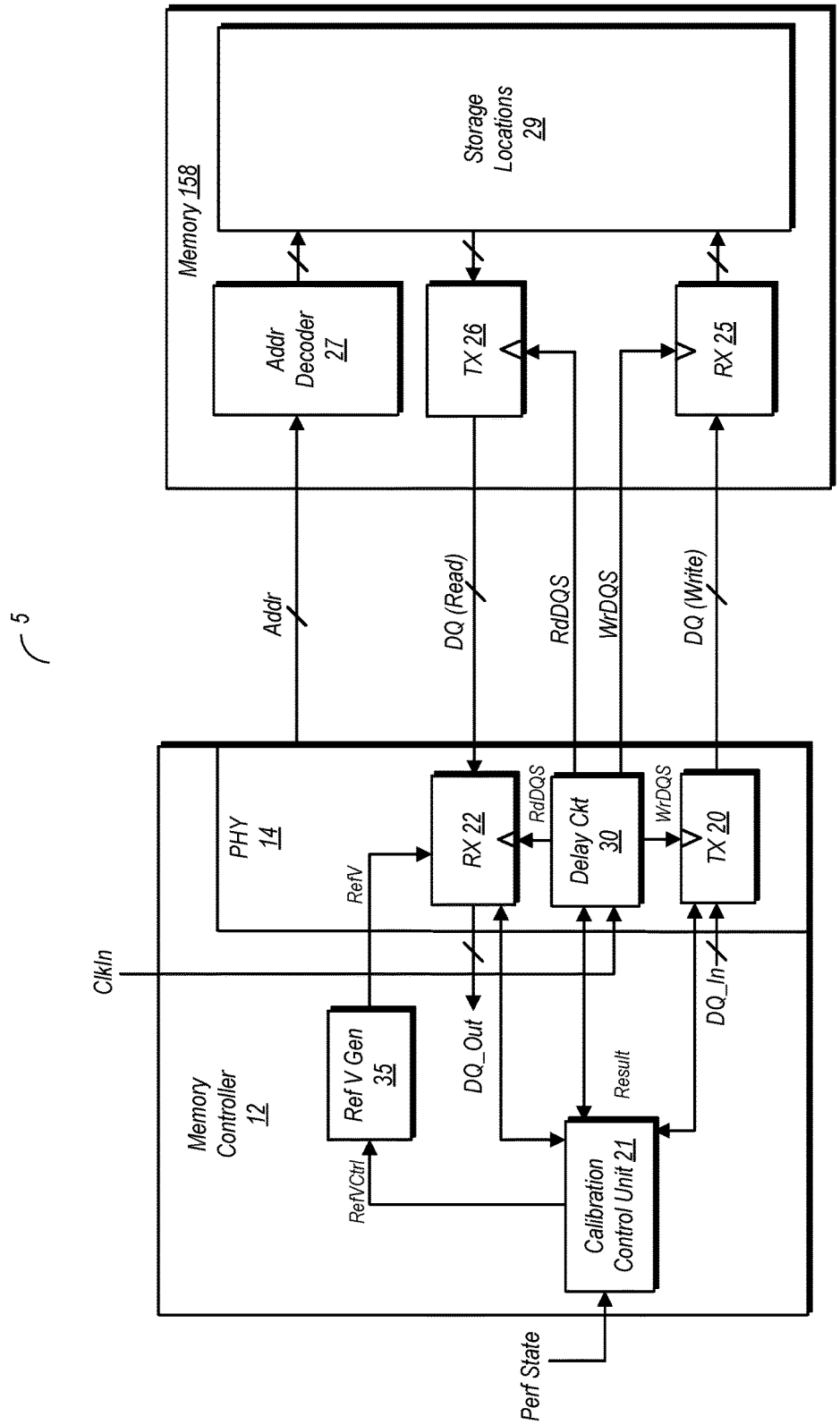
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes calibration control unit 21, which may perform various functions, including conducting various embodiments of a calibration method discussed below.

Physical layer 14 includes a delay circuit 30 that is coupled to receive an input clock signal ('Clk'), which may be used as a basis for generating data strobe signals. In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in calibration control unit 21. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, procedures to calibrate the data strobe signals to compensate for inherent delays may be performed at certain times during operation of memory controller 12 in order to optimize the point in time at which the data strobe signals sample data. The calibration procedures may be conducted under the control of calibration control unit 21, and involve performing a number of reads from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of calibration control unit 21. The reference voltage may be that voltage that is used to distinguish between a logic 0 and a logic 1. Over time, due to process, voltage, and temperature variations, the reference voltage may need to be calibrated. This calibration may also be performed periodically, and may sometimes be referred to as a vertical calibration. Based on the calibration, calibration control unit 21 may set the reference voltage at reference voltage generator 35 using the signal RefVCtrl. The reference voltage, RefV, or an indication of the same, may be provided from reference voltage generator 35 to receiver 22.

Figure 3:
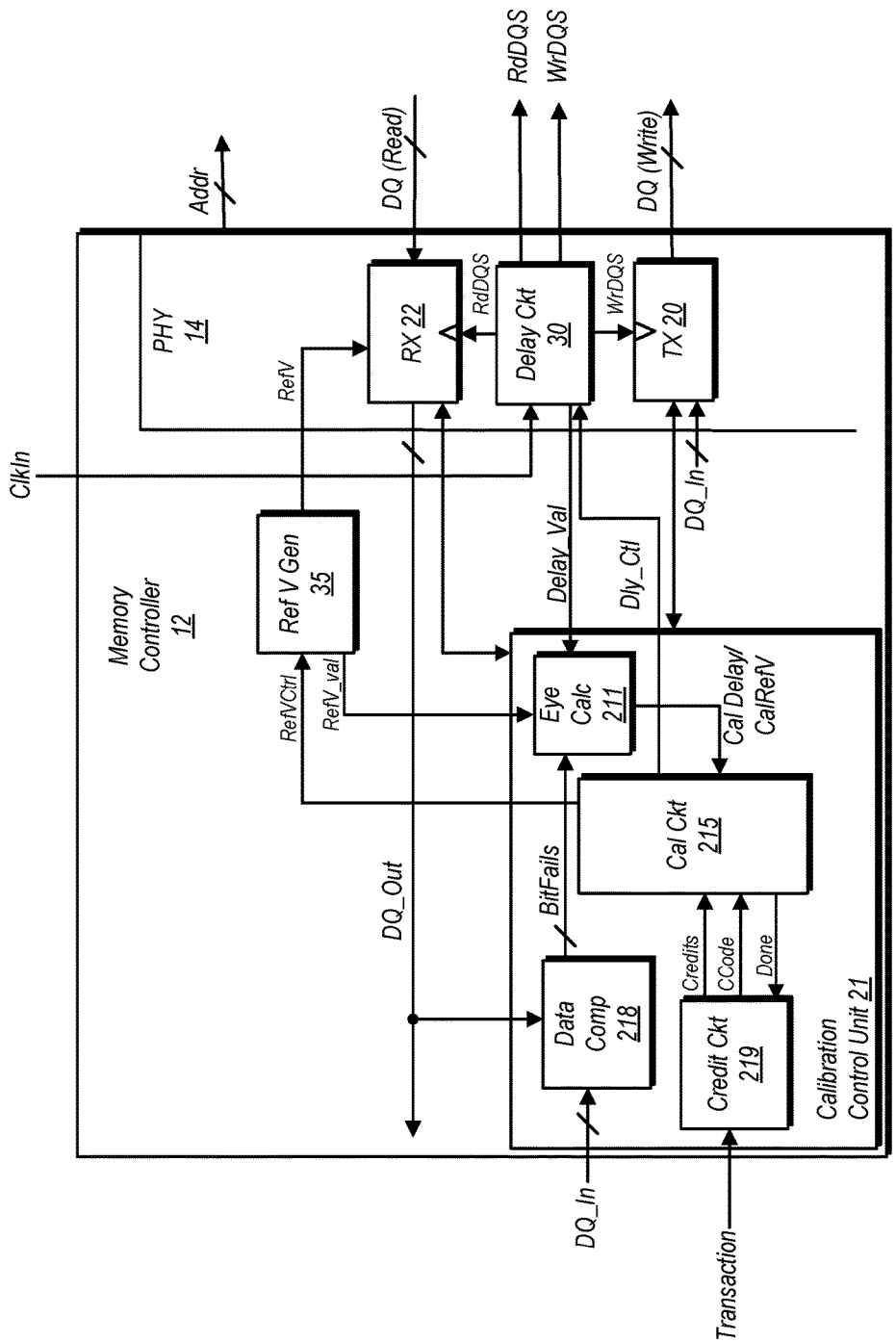
FIG. 3 is a block diagram illustrating further details of one embodiment of a memory controller.

FIG. 3 further illustrates one embodiment of a memory controller having a calibration control unit. In the embodiment shown, calibration control unit includes a calibration circuit 215, an eye calculation circuit 211, a credit circuit 219, and a data comparison circuit 218.

During calibration operations, the data comparison circuit 218 may receive data that is to be written to the memory via the DQ_In input. Data that is read from memory may be received by data comparison circuit 218 from receiver 22, via the DQ_Out path. The data read from memory may then be compared to data that was written to determine if any bit fails (i.e. bits in particular positions in which the read data and write data do not match in logical value). Bit fails ('BitFails' as shown in the drawing), may be reported to eye calculation circuit 211 as they occur. Responsive to receiving information of a bit fail, eye calculation circuit 211 may record the failing bit along with the reference voltage value and the delay value (as applied to the data strobe). Based on the data from failing bits and corresponding reference voltage and delay values, eye calculation circuit 211 may calculate an eye opening for each bit position. The eye opening data, as well as the calibrated delay and the calibrated reference voltage ('CalRevV'), may be forwarded to calibration circuit 215.

In some instances, the time to perform a calibration may be limited, and may thus not permit a full calibration to be performed. Calibrations routines performed by calibration circuit 215 may thus be subdivided, in time, into segments, and further subdivided into counts, or calibration points. For example, a segment in one embodiment may be 8 microseconds, and may provide sufficient time to calibrate 20 calibration points of a DLL in delay circuit 30. A calibration point may be equivalent to a particular delay provided by the DLL circuit (i.e. performing writes of data to memory, reading back the data from memory, and comparing the written data to the read data with the data strobe at a particular delay provided by the DLL). If a complete calibration requires, e.g., 10 segments, it thus requires 80 microseconds to complete. However, at times, pending transactions or other needs of the system may not allow the full time available to perform the entire calibration. Thus, the calibration may be performed in segments of time during which normal memory traffic is blocked. Credit circuit 219 in the embodiment shown may provide indications of the amount of time needed to perform a calibration or to complete a segment, as is further described below.

It is noted that while the functions performed by calibration control unit 215 have been described as having been carried out by circuitry, embodiments are possible and contemplated in which at least some of the functions are carried out by software and/or firmware. It is further noted that while both read data strobe and write data strobe signals have been disclosed, the discussion below focuses on a singular data strobe signal. This singular data strobe signal may be interpreted as the read data strobe or the write data strobe. Furthermore, the methodology discussed herein may apply to either of the data strobe signals disclosed herein, and the circuitry for performing the same may be re-configured to reflect such embodiments.

In the illustrated embodiment, credit circuit 219 may provide one of three different codes to calibration circuit 215. These codes are defined herein as a red code, a yellow code, or a green code, although the particular nomenclature is not intended to be limiting. The particular code provided by credit circuit 219 may be based at least in part on whether a transaction is pending, as well as on other conditions. In the embodiment shown, credit circuit 219 is coupled to receive a transaction signal ('Transaction') from an external source any time a transaction is pending. In some embodiments, credit circuit 219 may also be coupled to receive information regarding the priority or latency requirements for a pending transaction, if applicable. The transaction signal may be generated by, e.g., ORing together signals from all sources in the system from which a memory transaction may be initiated, or by any other suitable mechanism.

Credit circuit 219 in the embodiment shown is configured to provide a red code to the calibration circuit whenever a transaction is pending upon memory controller 12 exiting a low power state, such as a power gated state or a clock gated state. A red condition code may also be provided by credit circuit 219 when a transaction has been pending for at least a predetermined duration. When the condition code is red, calibration circuit 215 either inhibits a calibration from being initiated, or terminates any calibration procedure that is currently in progress. The termination of the calibration, or inhibiting imitation thereof, may occur irrespective of whether any credits were provided to calibration circuit 215.

Credit circuit 219 in the illustrated embodiment may provide a yellow condition code any time a transaction has been pending for less than predetermined duration discussed in the paragraph above, but for more than another, lesser duration. When the yellow condition code is active, calibration circuit 215 may perform calibration point for a given segment, decrementing the number of credits after each point is performed. Calibration points may continue to be performed by calibration circuit 215 as long as the number of credits is non-zero or the calibration code is green. Once the number of credits reaches zero while the yellow condition code is active, the current calibration segment is terminated.

A green calibration code may be provided by credit circuit 219 whenever memory controller 12 exits a low power state and no transactions are pending. The calibration code may remain green any time a transaction has been pending less than the lesser predetermined duration discussed above. Thus, if a transaction is initiated while the green condition code is in effect, any current calibration procedures may continue to be performed by calibration circuit 215 until the transaction has been pending for a duration sufficient to initiate the yellow condition code. Furthermore, the green condition code may remain in effect, and the calibration may continue to completion if no transactions are received (even if the credits have been decremented to zero). The green condition code may be changed to yellow by credit circuit 219 if a transaction is received and the second duration has elapsed. In some embodiments in which certain high priority transaction may be issued, the condition code may be changed from green to red responsive to initiation of such a transaction.

Essentially, the condition code and the number of available credits may indicate an amount of time left to complete at least a current segment of the calibration. The red condition code, when active, may indicate that there is no time remaining to continue the calibration, and that it is to be terminated immediately. The yellow condition code, when active, indicates that there is a limited time to perform points of a calibration. The Green condition code, when active, indicates that there are no current limits bounding the time available to perform the calibration, and that it can be performed either until complete or until the condition code changes.

Figure 4:
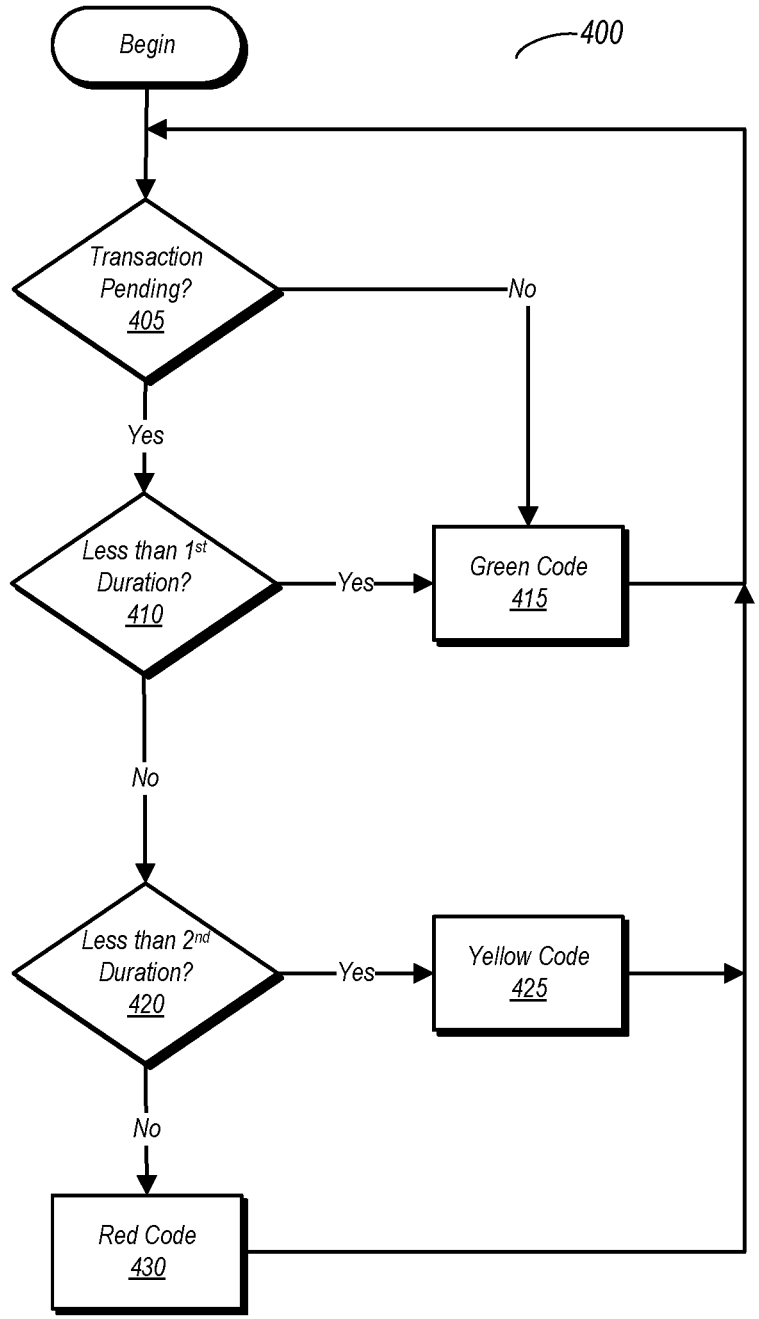
FIG. 4 is a flow diagram illustrating one embodiment of a method for operating a memory subsystem in conjunction with performing calibrations.

FIG. 4 is a flow diagram illustrating one embodiment of a method for operating a memory subsystem in conjunction with performing calibrations. Method 400 may be performed by any of the various hardware embodiments discussed above. The performing of method 400 with hardware embodiments not explicitly discussed herein is also contemplated, and thus such embodiments are considered to fall within the scope of this disclosure. It is also contemplated that at least some portions of method 400 may be performed with software and/or firmware.

Method 400 in the illustrated embodiment is not associated with any low power state (e.g., coming out of a power gated state). Rather, method 400 applies to normal operations when the memory controller is fully powered on and handling transactions as they are received. More particularly, method 400 is directed to determining a condition code at a given instance during normal operation based on whether a transaction is pending, and if so, the duration of its pendency.

Method 400 begins with a determination of whether a transaction is pending (block 405), which may be performed by a credit circuit such as that discussed above. If no transaction is pending (block 405, no), then the green code becomes active. If a transaction is pending (block 405, yes), but has been pending for less than the first duration (block 410), yes, then the green code becomes active (block 415). When the green code is active, a calibration in progress may be performed until either it is complete, or until the condition code changes, and the time restrictions on the calibration change correspondingly.

If a transaction is pending (block 405, yes) but for not less than the first duration (block 410, no) but less than the second duration (block 420, yes), then the yellow code becomes active (block 425). When the yellow code is active, the calibration may be conducted as long as credits are available. After a portion of the calibration procedure is conducted at a particular DLL point (i.e. a particular delay), the number of credits will be decremented. Once the credits are decremented to zero, any calibration procedure in progress is terminated, and the transaction may be serviced unless the condition code is green.

If a transaction is pending for not less than the second duration (block 420, no), then the red code becomes active (block 430). When the red code is active, the performing of a calibration is inhibited, even if otherwise scheduled for that time. If a calibration is in progress when the red code is provided by the credit circuit, it is terminated upon completion of the current calibration point. The pending transaction may then be serviced.

In an alternate embodiment, a minimum/maximum segment may be implemented for operations in which the red code becomes active or the green code is already active while a calibration segment is in progress. In this alternate embodiment, an in-progress calibration would not terminate the current segment unless the minimum number of calibration points have been performed. Furthermore, rather than extending the calibration indefinitely in this particular embodiment, the green code may be limited to extend a calibration segment to a maximum number of points. Consider an example wherein the minimum number of points is 10 and the maximum number of points is 20. In such an implementation, if the red condition becomes active while a calibration is in progress, the current segment is not terminated until at least 10 calibration points have been performed. When the green code is active, the current segment is not extended beyond 20 calibration points.

Figure 5:
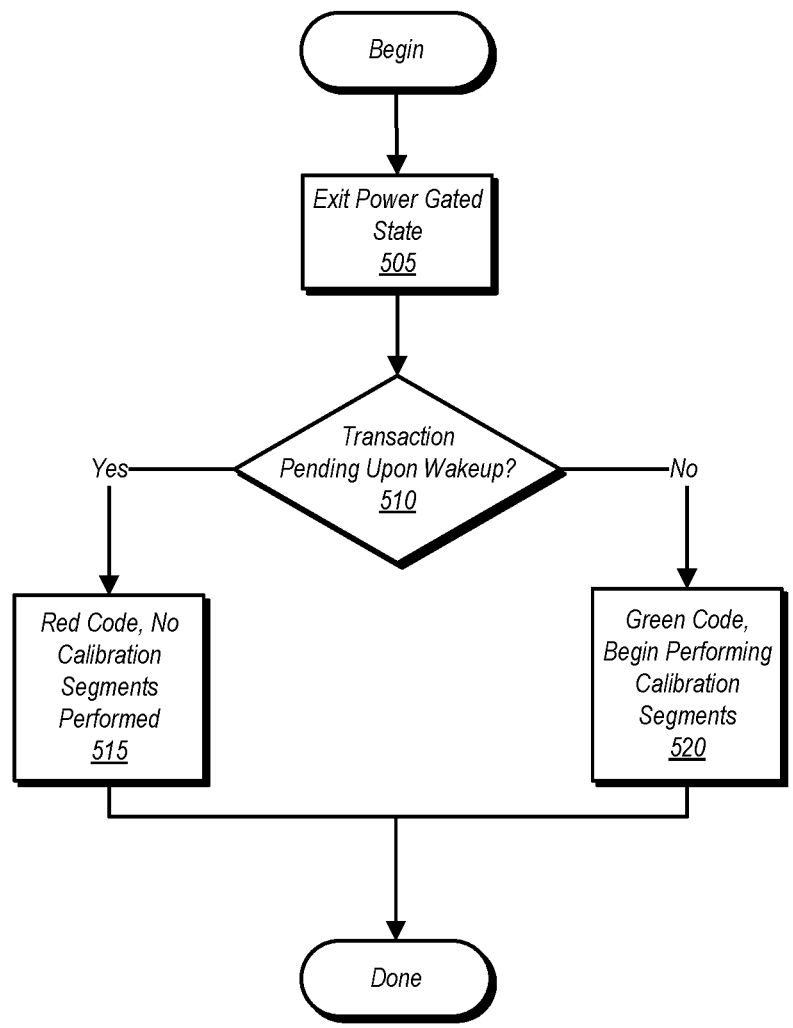
FIG. 5 is a flow diagram illustrating another embodiment of a method for operating a memory subsystem in conjunction with performing calibrations.

FIG. 5 is another embodiment of a method for operating a memory subsystem in conjunction with performing calibrations. In contrast to method 400 of FIG. 4, method 500 of FIG. 5 is directed to determining a condition code upon waking up from a low power state. As with method 400, method 500 may also be performed with any of the various hardware embodiments discussed above, as well as with embodiments not explicitly discussed herein. Furthermore, various portions of method 500 may in some embodiments be performed with software and/or firmware.

Method 500 begins with the exit from a power gated state (block 505). More generally, block 505 may apply to any low power state, including (but not limited to) a clock gated state in addition to or in lieu of the power gated state used as an example here. Upon exit from the low power state, a determination is made as to whether a memory transaction is pending. If a transaction is pending upon wakeup (block 510, yes), then the red code become active (block 515), and no calibration segments are performed. Otherwise, if no transaction is pending upon wakeup (block 510, no), the green code become active and calibration segments may be performed (block 520). The calibration segments may be extended while the green code is active even if no credits are available or have otherwise been extinguished.

Figure 6:
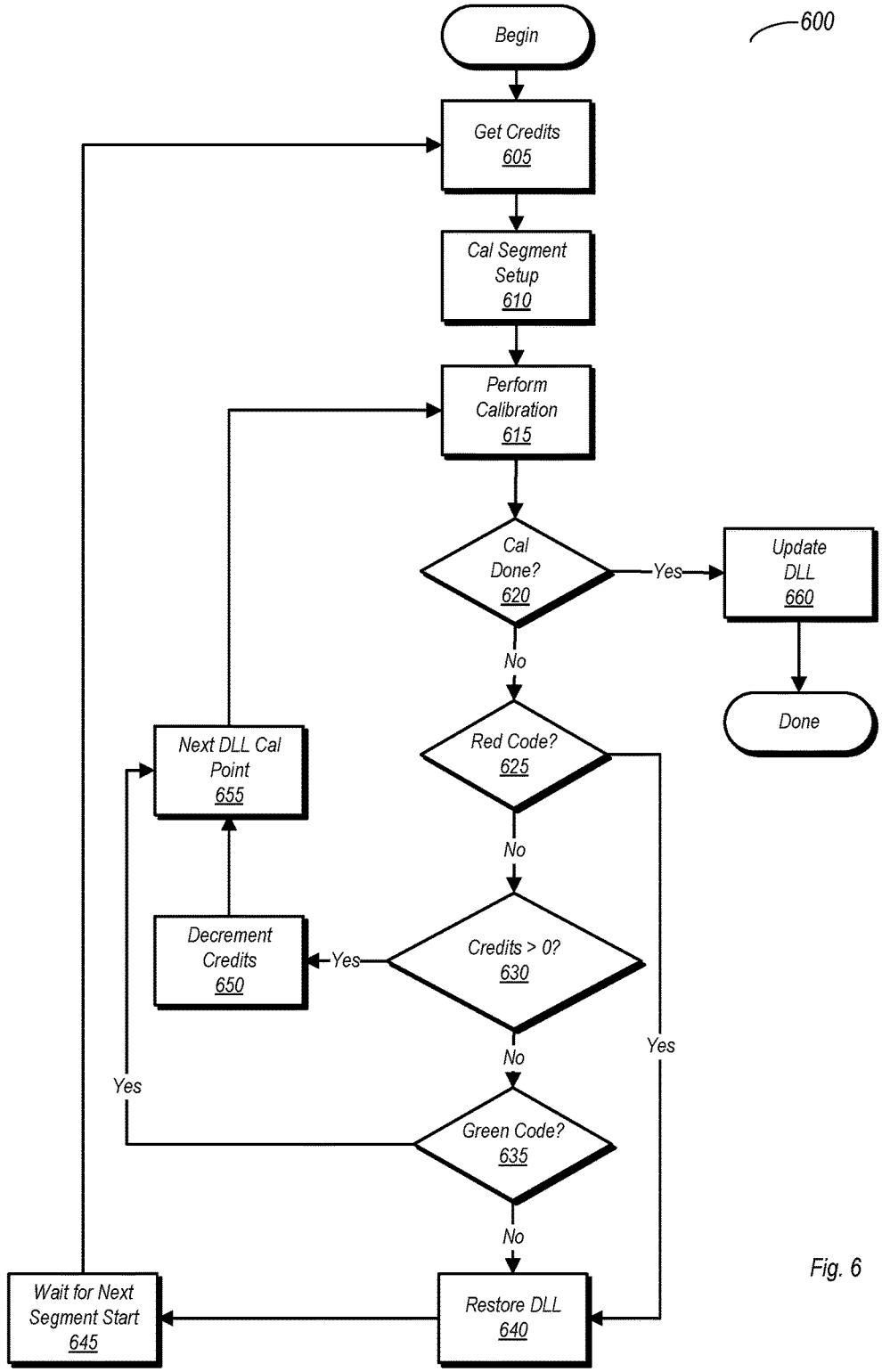
FIG. 6 is a flow diagram illustrating another embodiment of a method for operating a memory subsystem in conjunction with performing calibrations.

FIG. 6 is a flow diagram illustrating another embodiment of a method for operating a memory subsystem in conjunction with performing calibrations. As with methods 400 and 500 discussed above, method 600 may be performed with any embodiment of hardware discussed above as well as with embodiments not explicitly discussed herein. Furthermore, it is contemplated that at least portions of method 600 may be performed with software and/or firmware.

Method 600 begins with the issuing of credits by the credit circuit to a calibration circuit (block 605). A calibration segment setup may be performed (block 610), which may include determining which DLL points (or delays) at which the calibration is to be conducted. After setting up the calibration, the performance of the calibration segment may commence (block 615).

If the calibration is complete (i.e. if all segments of the calibration have been performed; block 620, yes) then the DLL may be updated (block 660) and method 600 is complete. If the calibration is not complete (620, no), and the condition code is red (block 625, yes), then the calibration is terminated and the DLL is restored to its most recently calibrated state (block 640). It is noted that in this particular example, the calibration may have commenced while the condition code was not red, with a subsequent change of code thereto, e.g., to a request for a high priority transaction.

If the current code has not changed to the red code (block 625, no), but the number of available credits is greater than zero (block 630, yes), then the number of credits may be decremented (block 650) after completing the current calibration point. Thereafter, calibration may proceed to next calibration point (block 655), with the method returning to block 615.

If the number of credits is zero (block 630, no), but the code is the green code (block 635, yes), then the method will proceed to the next DLL calibration point (block 655) upon completion of the current point. When the green code is in effect, the calibration may continue to be performed until it is complete unless the code is otherwise changed to yellow or red.

If blocks 630 and 635 both yield a 'No', the state of the DLL is restored (block 640) and method 600 then waits until the next calibration segment is to start (block 645). After block 645, method 600 may return to block 605. Credits may be decremented when either of the yellow or green codes are active, as block 630 makes no distinction between particular codes. However, if the code was yellow and the credits have decremented to zero, blocks 630 and 635 will both yield a respective 'No' in the illustrated embodiment.

Method 600 may be performed until the calibration is fully complete. However, since transactions may arrive during the performance of method 600, the performance of the calibration may be on a segment-by-segment, and point-by-point basis, with interruptions to the calibration caused by servicing the requested transactions.

Figure 7:
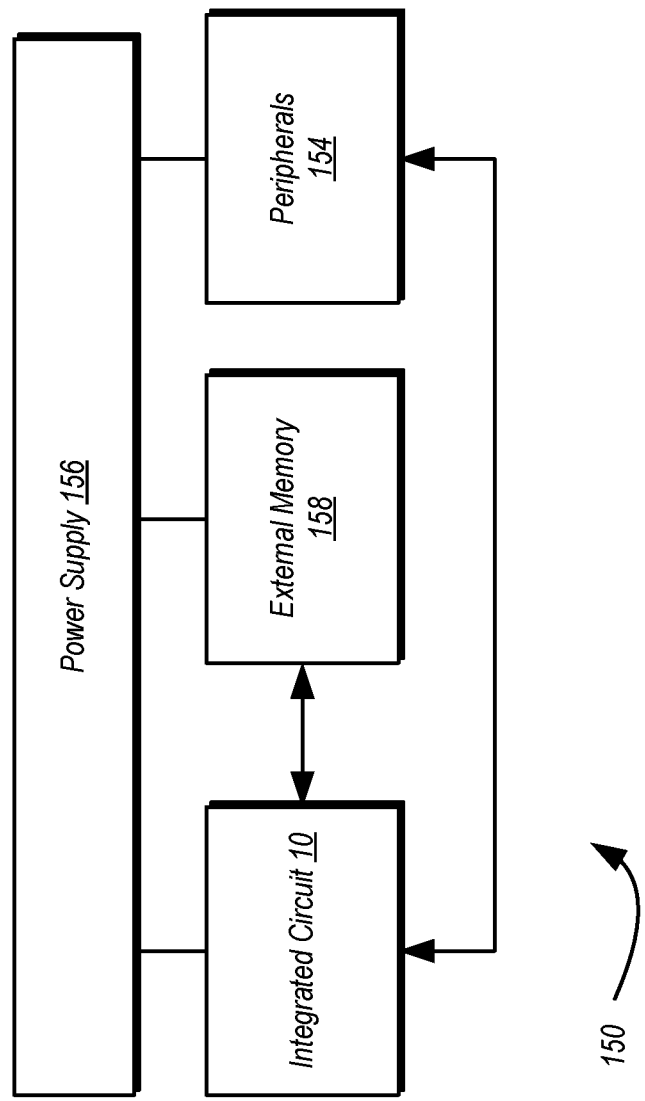
FIG. 7 is a block diagram of one embodiment of an exemplary system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A system comprising:
    a memory subsystem including a memory and a memory controller coupled to the memory, wherein the memory controller is configured to convey a data strobe signal to the memory during transfers of data to and from the memory, wherein the memory controller includes a credit circuit and a calibration circuit, wherein:
    the calibration circuit is configured to initiate a calibration of the memory subsystem wherein the calibration includes calibrating a delay applied to a data strobe conveyed from the memory controller to the memory, and wherein the calibration is subdivided into a number of segments, wherein each segment comprises a plurality of delay points, each delay point corresponding to a delay provided by a delay locked loop (DLL);
    the credit circuit is configured to provide a condition code and one or more credits to the calibration circuit, the condition code and the number of credits being indicative of an amount of time remaining to perform segments of the calibration, wherein the condition code is one of a first, second, or third condition code and the one or more credits are provided during initiation of a segment of the calibration; and
    the calibration circuit is further configured to terminate the calibration responsive to determining, based on the condition code, that there is insufficient time to complete at least a current segment of the calibration.

2. The system as recited in claim 1, wherein the calibration circuit is configured to, responsive to receiving the first condition code:
    determine if a number of credits available exceeds zero;
    perform the calibration for at least one delay point of the DLL;
    cause the credit circuit to decrement a number of credits available responsive to completing the calibration at the at least one delay point;
    repeat determining, performing calibration of delay points, decrementing the number of credits, and determining the number of credits as long the number of credits available exceeds zero and the condition code remains the first condition code.

3. The system as recited in claim 2, wherein the credit circuit is configured to provide the first condition code responsive to determining that a transaction has been pending for at least a first amount of time but less than a second amount of time.

4. The system as recited in claim 3, wherein the credit circuit is configured change from the first condition code to the second condition code responsive to determining that the transaction has been pending for at least the second amount of time.

5. The system as recited in claim 1, wherein the calibration circuit is configured to inhibit performing any calibration segments responsive to receiving the second condition code.

6. The system as recited in claim 5, wherein credit circuit is configured to provide the second condition code responsive to one of the following:
    determining that a transaction is pending upon exit from a power gated condition;
    determining that a transaction has been pending for at least a predetermined period of time.

7. The system as recited in claim 1, wherein the calibration circuit is configured to perform the calibration responsive to receiving the third condition code and further configured to continue performing the calibration without any subsequent change to the condition code.

8. The system as recited in claim 6, wherein the credit circuit is configured to provide the third condition code responsive to one of the following:
    determining that no transactions are pending upon exit from a power gated condition;
    determining that no transaction have been pending more than a predetermined amount of time.

9. The system as recited in claim 1, wherein the calibration circuit is configured to complete the calibration by performing a predetermined number of segments of equal amounts of time.

10. The system as recited in claim 1, wherein the credit circuit is further configured to update the condition code responsive to determining that a transaction has been received and has been pending for at least a predetermined amount of time.

11. A method comprising:
    initiating, in a calibration circuit of a memory controller, a calibration of a memory subsystem having a memory and the memory controller, wherein the calibration includes calibrating a delay applied to a data strobe conveyed from the memory controller to the memory; and wherein the calibration is performed subdivided, in time, into a number of segments, wherein each segment comprises a plurality of delay points, each delay point corresponding to a delay provided by a delay locked loop (DLL);
    a credit circuit issuing a condition code and one or more credits, to a calibration circuit, responsive to the initiating of the segment of the calibration, wherein the condition code is indicative of an amount of time remaining to perform segments of the calibration, the condition code being one of a first, second or third condition code; and
    terminating the calibration responsive to determining that there is insufficient time to complete at least a current segment of the calibration, wherein determining is based at least in part on the condition code.

12. The method as recited in claim 11, further comprising:
    receiving, at the calibration circuit, the first condition code;
    the calibration circuit determining if one or more credits are available;
    the calibration circuit performing a portion of the calibration responsive to determining that one or more credits are available;

the credit circuit decrementing the number of credits responsive to the calibration circuit completing the portion;

repeat determining, performing, and decrementing as long as the number of credits remains zero and the condition code remains the first condition code.

13. The method as recited in claim 11, further comprising inhibiting performance of any calibration segments responsive to receiving the second condition code.

14. The method as recited in claim 13, further comprising the credit circuit providing the second condition code responsive to one of the following:

determining that a memory transaction is pending upon exit of the memory subsystem from a power gated condition;

determining that a transaction has been pending for at least a predetermined amount of time.

15. The method as recited in claim 11, further comprising:

receiving the third condition code;

beginning performance of the calibration; and continuing performance of the calibration until the calibration completes or until one or more changes to the condition code results in termination of the calibration.

16. The method as recited in claim 15, further comprising providing the third condition code responsive to one of the following:

determining that no transactions are pending upon exit of the memory subsystem from a power gated condition; and determining that no transaction have been pending for more than a predetermined amount of time.

17. The method as recited in claim 11, further comprising changing the condition code from the third condition code to the first condition code responsive to an incoming memory transaction pending for at least a predetermined amount of time after having been received while the third condition code is active.

18. A memory subsystem comprising:

a memory; and a memory controller coupled to the memory, wherein the memory controller includes a calibration circuit configured to perform a calibration of a delay applied to a data strobe signal conveyed from the memory controller to the memory, and wherein the memory controller further includes a credit circuit configured to indicate an amount of time available for performing the calibration, wherein the calibration is subdivided, in time, into a number of segments, wherein each segment comprises a plurality of delay points, each delay point corresponding to a delay provided by a delay locked loop (DLL);

wherein the credit circuit is configured to provide a condition code and one or more credits to the calibration circuit, the condition code and the number of credits being indicative of an amount of time available to continue performance of the calibration; and wherein the calibration circuit is configured to terminate performance of the calibration based on at least one of the condition code indicating the calibration is to be terminated or the number of credits being zero.

19. The memory subsystem as recited in claim 18, wherein the calibration circuit is configured to:

inhibit further performing of the calibration responsive to receiving red condition code;

perform the calibration while decrementing the number of credits responsive to receiving a yellow condition code, wherein the calibration circuit is further configured to terminate the calibration when the number of credits has been decremented to zero; and perform the calibration irrespective of the number of credits responsive to receiving a green condition code.

* * * * *